United States Patent [19]

Chang

[11] Patent Number: 5,121,336

[45] Date of Patent: Jun. 9, 1992

[54] METHOD FOR DETERMINING AIR-BRIDGE POST PLACEMENT

[75] Inventor: Kou-Chuan Chang, Renton, Wash.

[73] Assignee: The Boeing Company, Seattle, Wash.

[21] Appl. No.: 262,973

[22] Filed: Oct. 26, 1988

[51] Int. Cl.$^5$ ............................................ G06F 15/60
[52] U.S. Cl. ...................... 364/491; 364/490; 364/489; 364/488
[58] Field of Search ................ 364/488, 489, 490, 491

[56] References Cited

U.S. PATENT DOCUMENTS

| | | | |
|---|---|---|---|
| 3,603,771 | 9/1971 | Isett et al. | 364/491 |
| 3,681,782 | 8/1972 | Scanlon | 364/491 |
| 4,577,276 | 3/1986 | Dunlop et al. | 364/490 |
| 4,613,941 | 9/1986 | Smith et al. | 364/490 |
| 4,630,219 | 12/1986 | DiGiacomo et al. | 364/488 |
| 4,686,629 | 8/1987 | Noto et al. | 364/488 |
| 4,731,594 | 3/1988 | Kumar | 333/103 |

OTHER PUBLICATIONS

"Compaction Based Custom LSI Layout Design Method" by M. Ishikawa et al., IEEE International Conf. on Computer-Aided Design, Nov. 18-Nov. 21, 1985, pp. 343-345.

*Primary Examiner*—Parshotam S. Lall
*Assistant Examiner*—V. N. Trans
*Attorney, Agent, or Firm*—Donald J. Lisa

[57] ABSTRACT

For air-bridges running orthogonally to the channel, a detailed routing of the interconnect lines is performed. A post expansion is then performed to spread existing lines by adding more tracks if required for support posts. The interconnect lines are then scanned to determine post placements. For air-bridges running parallel to the channel, empty post positions are determined and aligned to optimize the distance between positions. Detailed routing is then performed and the lines are scanned to determine post placement. Finally, cell rows and interconnects are compacted.

4 Claims, 7 Drawing Sheets

METHOD FOR DETERMINING AIR-BRIDGE POST PLACEMENT

BACKGROUND OF THE INVENTION

The present invention relates, in general, to a method for determining air-bridge post placement and, more particularly, to a method for determining air-bridge post placement in the production of gallium arsenide type semiconductor devices.

In producing large scale semiconductor devices, it is necessary to provide interconnecting lines between various discrete devices within the large scale device. As the number of discrete devices increases, the number of interconnect lines increases, often exponentially. The formation of interconnect lines is typically accomplished using at least two layers of metal. The conducting lines running in one direction (vertically) are placed on the first layer and the lines running perpendicular to the first lines (horizontally) are placed on the second layer.

The discrete semiconductor devices are generally organized in cell rows with channels disposed therebetween for the interconnect lines. Areas in the cell rows, called feedthroughs are provided for the passage of interconnect lines that must pass over, or through, a cell row. These feedthroughs may also be provided within a cell.

Typically, the interconnect lines will be deposited on an oxide substrate. However, a gallium arsenide (GaAs) device's frequency of operation is limited typically by the capacitance on its critical metal interconnections. Since the dielectric constant of air is lower than that of oxide, the second metal interconnect layer in gallium arsenide is preferably a gold air-bridge suspended on posts above the substrate and the oxide.

Because of the weight of the interconnect lines and the lack of support between connecting posts, it is often necessary to place intermediate supporting posts. Leaving room for these intermediate posts can pose substantial layout problems when designing a circuit.

Accordingly, it is an object of the present invention to provide a method for determining air-bridge post placement that overcomes the above deficiencies.

A further object of the present invention is to provide a method for determining air-bridge post placement which may be implemented utilizing computer aided design equipment.

Another object of the present invention is to provide a method for determining air-bridge post placement which will minimize the number of posts utilized.

Still another object of the present invention is to provide a method for determining air-bridge post placement which minimizes the area expansion to make room for the required posts.

SUMMARY OF THE INVENTION

A first particular method for determining air-bridge post placement is for devices which have air-bridges running orthogonally to the channels. First, detailed routing of the interconnect lines is performed. A post expansion step is then taken which will spread existing lines by adding more tracks if space is required for a support post. The next step is to review the proposed interconnect lines to determine which lines will require post additions and where those posts will be placed.

A second particular method is for devices which have air-bridges running parallel to the channels. First, empty positions where posts may be placed are determined. These empty positions are aligned to optimize the distance between the empty positions based on the maximum length of an interconnect line set forth in the design rules. This acts to reserve post positions where they may be required for support posts. Detailed routing is then performed. Using the detailed routing, each wire is reviewed to determine which wires will require post additions and where those posts will be placed.

DETAILED DESCRIPTION OF THE DRAWINGS

Figure 1:
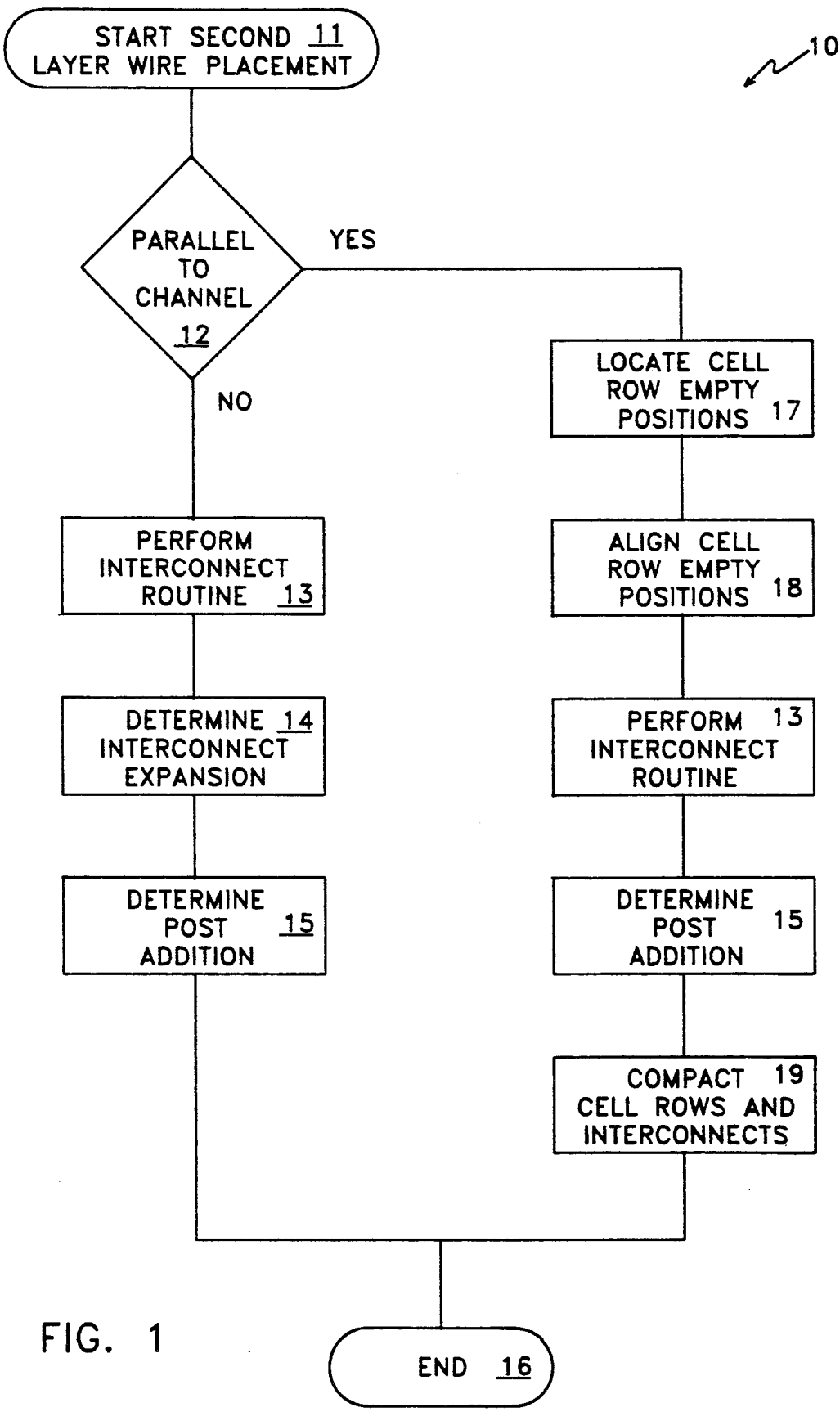
FIG. 1 is a flow chart of a method embodying the present invention.

In FIG. 1, a flow chart, generally designated 10, embodying a method of the present invention is illustrated. The method commences at block 11 with the placement of the second layer wires. The first step, step 12, is to determine if the second layer wires are parallel to the channel. If they are not parallel, then the wires are orthogonal to the channel and the method moves on to a step 13.

In step 13, a detailed interconnect routing of the circuit is performed. This routing is illustrated in the interconnect diagram, generally designated 40, of FIG. 3. The interconnect lines are labeled 1–10 with like ends labeled the same. Cross hatched areas 41 represent connecting vias. Since the vertical and horizontal lines are disposed on two different planes, interconnecting vias 41 are required to make electrical contact between the line portions. Single hatched areas 42 represent the points where perpendicular lines cross but are not connected.

For purposes of clarity, the next two steps of flow chart 10, steps 14 and 15, will be taken out of order. Step 15 which is the determination of post additions will be discussed first. Using interconnect diagram 40 of FIG. 3, the addition of vertical posts will be illustrated in FIG. 4. For the following example, a design rule permitting three units of length between posts will be used.

Figure 3:
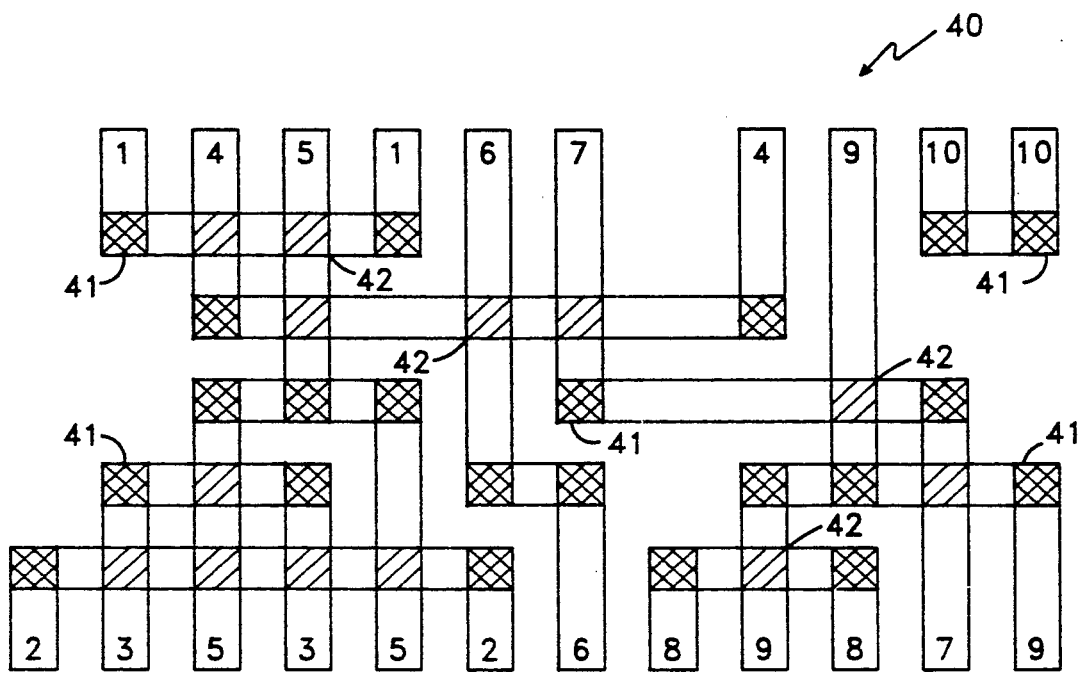
FIG. 3 is an interconnect layout before adjustment according to the present invention.

In an examination of FIG. 3, it will be seen that vertical portions of lines 6 and 9 exceed the three unit maximum while the vertical portions of lines 5 and 7 are right at three units. This requires that supporting posts be provided for lines 6 and 9.

Figure 4:
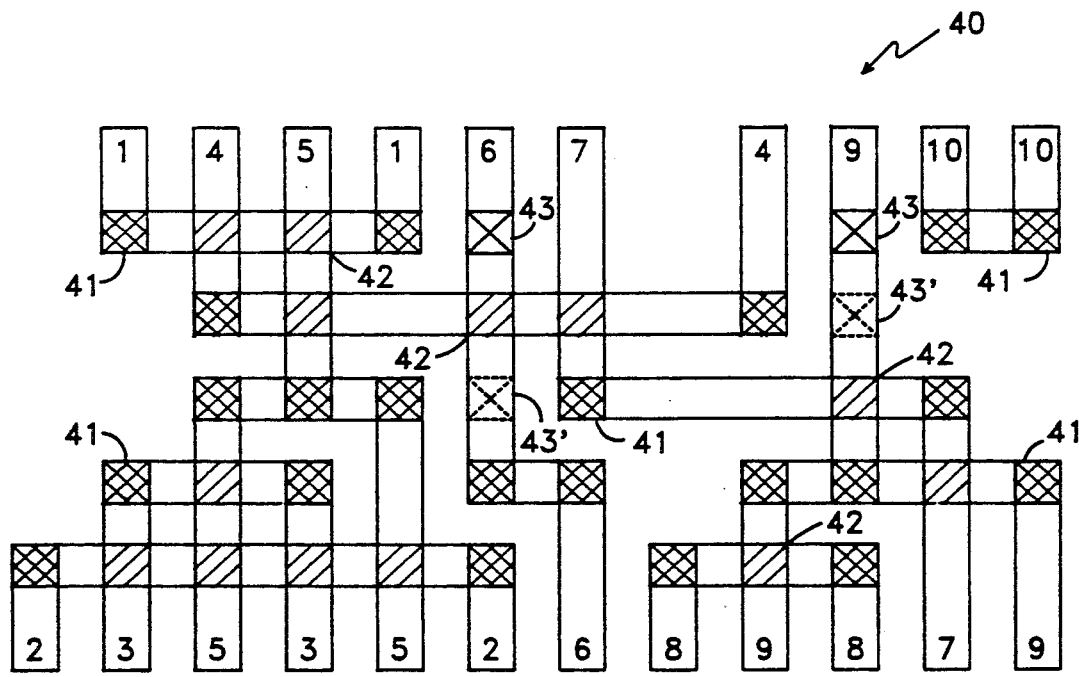
FIGS. 4–7 are interconnect layouts of FIG. 3 after being adjusted according to the present invention.

As shown in FIG. 4, support posts can be added at positions 43, designated by an "X". With these additional posts, there is no more than three units separating support posts. Alternatively, the posts could be disposed in areas 43' designated by the dashed "X". The exact placement would be determined by the program determining placement. In the present example, each wire is examined from bottom to top. This is accomplished by saving the post position as the LAST_POST. The system scans up the line until an empty position is reached. This empty position is stored as the LAST_EMPTY. When the maximum length is reached, if the position is empty then the LAST_EMPTY position is updated and this position is designated for a post. If the position at which a post is required coincides with an orthogonal wire, then the post is placed at the currently stored LAST_EMPTY position. The LAST_POST position is then updated to the LAST_EMPTY position, where the post was just placed. This process is then repeated over the length of the wire.

Figure 5:
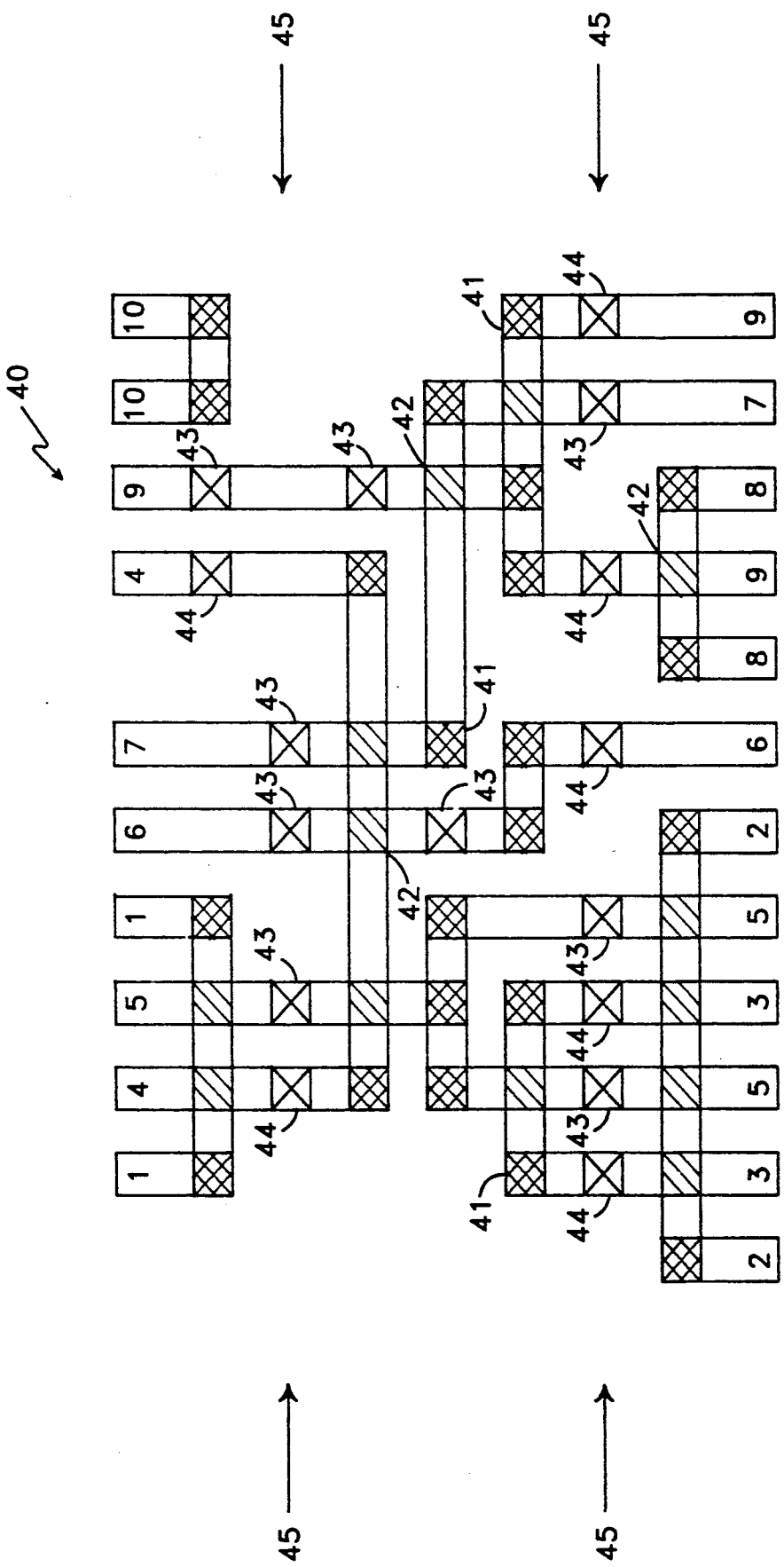

Returning now to step 14, interconnect expansion is determined. An interconnect expansion is necessary if a post is required and there is no place to deposit the post because of crossing interconnect lines. This is illustrated in FIG. 5 by changing the maximum distance between support posts to two units in the vertical direction. With this change more lines will need additional support posts.

In FIG. 3, vertical lines 5, 6, 7, and 9 all exceed the two unit distance and will require additional supports. However, there is no room to add supports to line 5 because of the cross over lines. Therefor, line 5 is expanded by adding rows (tracks), indicated by arrows 45, so that supports 43, represented by an "X", may be added.

In addition, posts 43 are added to lines 6, 7, and 9 where indicated. The expansion resulting from the addition of rows 45 has also lengthened lines 3, 4, 6, and 9 so that there are new portions which now exceed the two unit maximum distance. Therefore, a new set of post positions are required. These new post positions are designated 44.

The expansion is determined by locating all the vertical wires which span filled horizontal columns for more than a distance K, K being the maximum unit distance. These wires are then sorted according to non-decreasing order of their starting points. Two variables are then set up: LAST which is the smallest starting position among the wires; and NEXT, which is LAST+K. If a wire covers both LAST and NEXT positions, a row (track) is inserted at position NEXT. The values of LAST and NEXT are then updated and the process continues.

The method then proceeds to block 16 which is the finish.

Figure 2A:
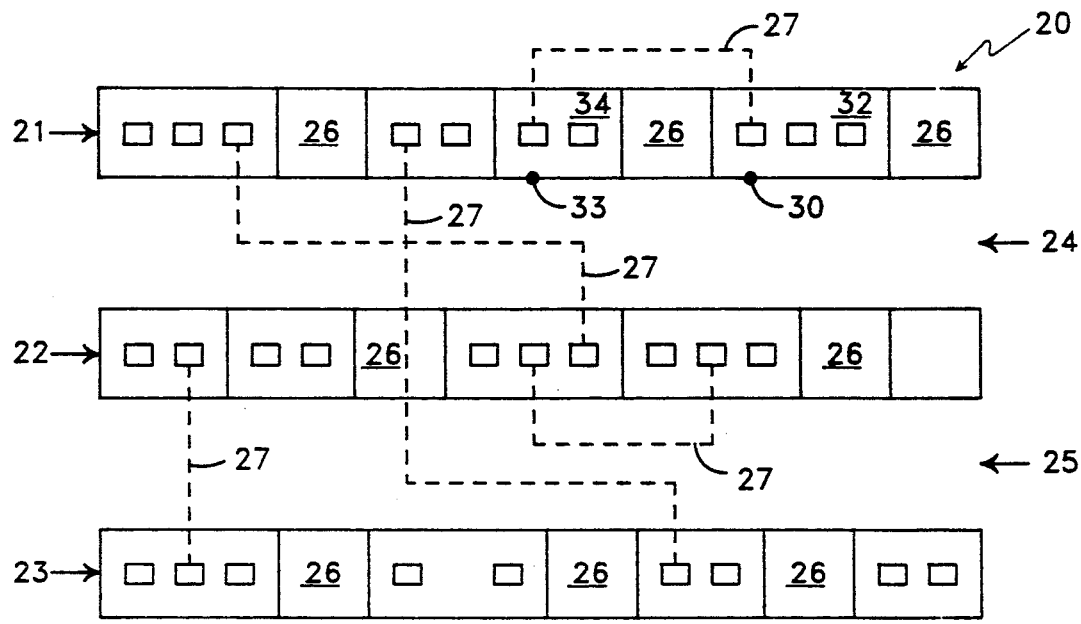
FIGS. 2A and 2B are block diagrams of a circuit layout modified according to a method of the present invention.
Figure 2B:
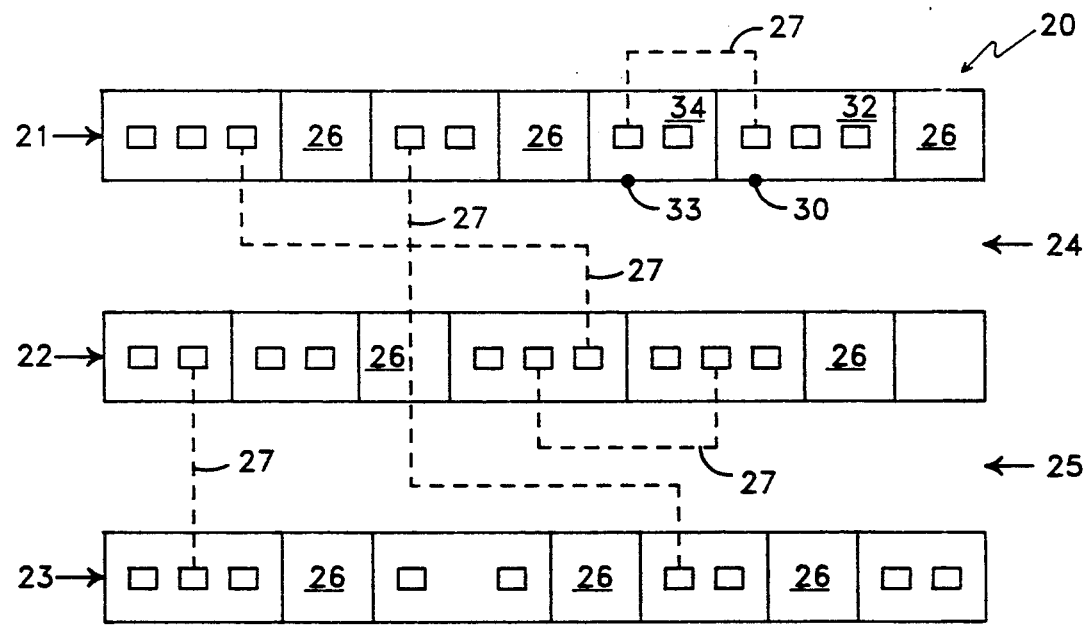

If the air-bridges are parallel to the channel, step 12 routes the process to a step 17. In step 17, empty positions are located which may be used for support posts for the interconnect lines. Referring to FIGS. 2A and 2B, a device layout, generally designated 20, is illustrated. Layout 20 consists essentially of cell rows 21–23 and channels 24 and 25 disposed therebetween. Proposed interconnects are illustrated as dashed lines 27.

The cell row's empty positions referred to in step 17 are feedthrough positions, such as feedthroughs 26, FIG. 2A; pin positions where the pin is accessed through the channel on the other side of the cell; and pin positions where no pins exist. Two pin positions labeled 30 and 33 are illustrated in FIG. 2A.

The next step in flow chart 10 is step 18 which is to align the empty positions. This alignment is performed to optimize the length of cell rows and reserve vertical positions for placing posts. Cells within cell rows are moved by inserting and/or removing feedthrough cells, and reassigning feedthrough nets so that the distance between two adjacent aligned cell row's empty positions does not exceed a specified distance. The distance is the maximum distance for an air-bridge without any supporting posts. For example, the routing pitch, or distance between line centers, may be ten microns and the maximum length of an air bridge without intermediate supports may be three units of the routing pitch or 30 microns. Note that the number of aligned cell row's empty positions may be more than needed. Only the minimum number of these aligned cell row's empty positions to guarantee that posts can be added to support the air-bridges according to the design rule are reserved.

In FIG. 2A, the distance between positions 30 and 33 is four units. In FIG. 2B, cell 34 has been moved to be adjacent to cell 32 thereby placing positions 30 and 33 within three units of each other. By disposing these empty positions at equal lengths along the cell row, it is insured that columns will be available for support posts when the post placement is determined. This step is performed at this point because the cell positions will not be able to be varied following the detailed interconnect routing step.

A detailed interconnect step is performed in step 13. This is the same type of interconnect step as performed for the orthogonally disposed air-bridges. Following the detailed interconnect step, the post addition is determined in step 15 in the same manner as described for step 15 with respect to the orthogonally disposed air-bridges, except that now the air-bridges are parallel to the channel.

Figure 6:
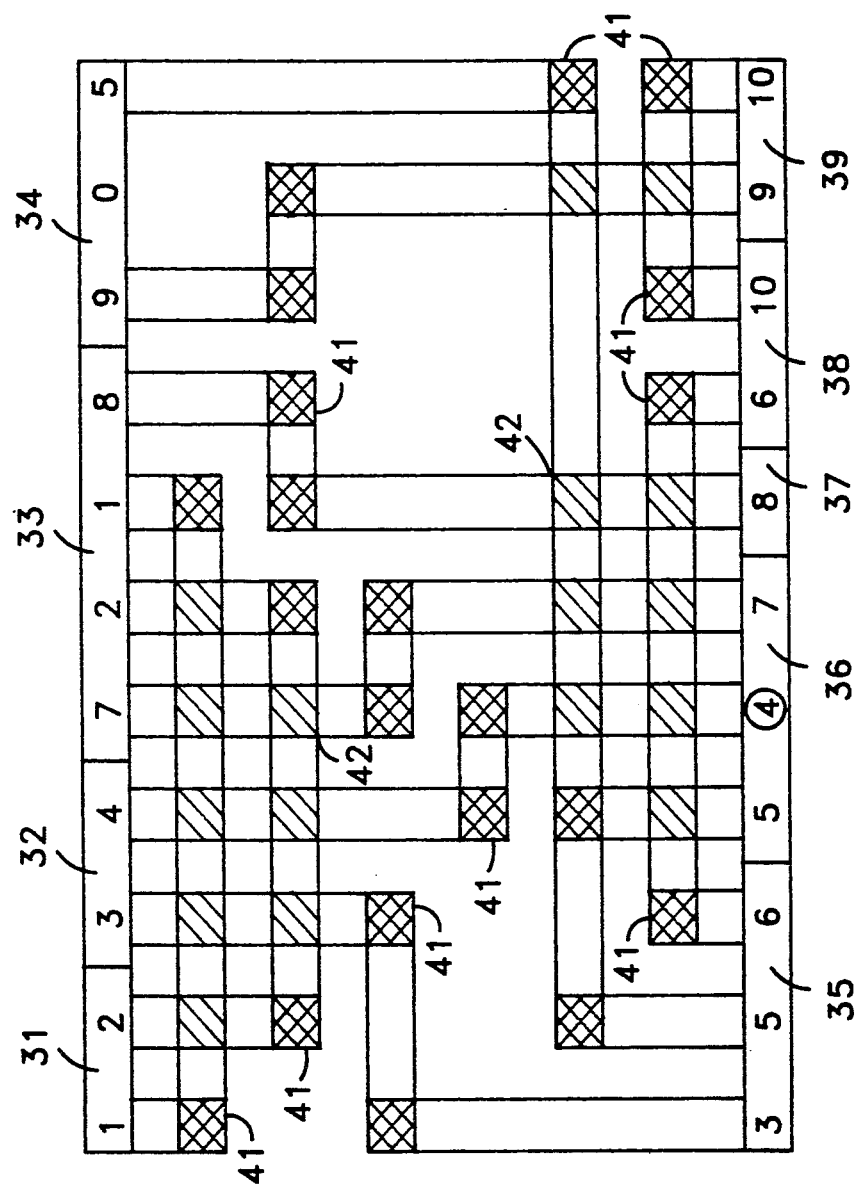

An example of the above is illustrated in FIG. 6. Horizontal rows are the air-bridges and the design rules allow the maximum air-bridge length without posts to be five units between posts.

In FIG. 6, cells 31–39 are in cell rows. Cell 37 is a feedthrough cell. There is one feedthrough position within cell 36 which is used by line 4. Cell 34 has an empty pin position which is noted by 0.

In viewing FIG. 6, it can be seen that line 1 exceeds the five unit maximum between posts. With the alignment process of step 18, feedthrough cell 46 between cell 32 and cell 33 is inserted to align with the feedthrough position in cell 36. Position for line 4 in the bottom row will be reassigned. The process continues to add a feedthrough cell 46 between cell 33 and cell 34, and two feedthrough cells 46 between cell 38 and cell 39. The right side of the two feedthrough cells is reassigned for line 4.

Figure 7:
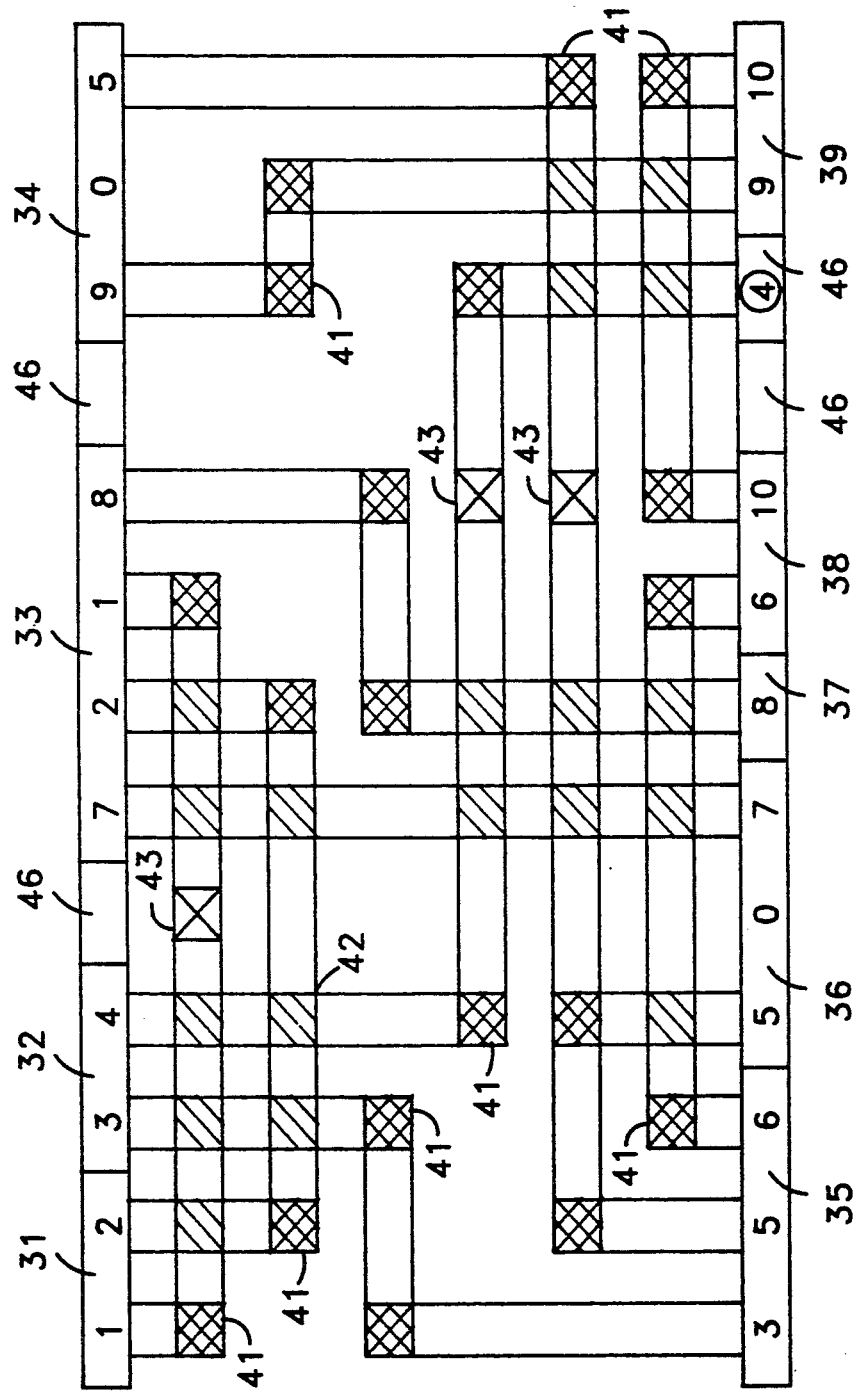

After two vertical empty locations are reserved, the interconnect routing is performed as step 13. Step 15 is used to add posts as before. Three posts are added which are noted as item 43. FIG. 7 shows the result after step 15.

Figure 8:
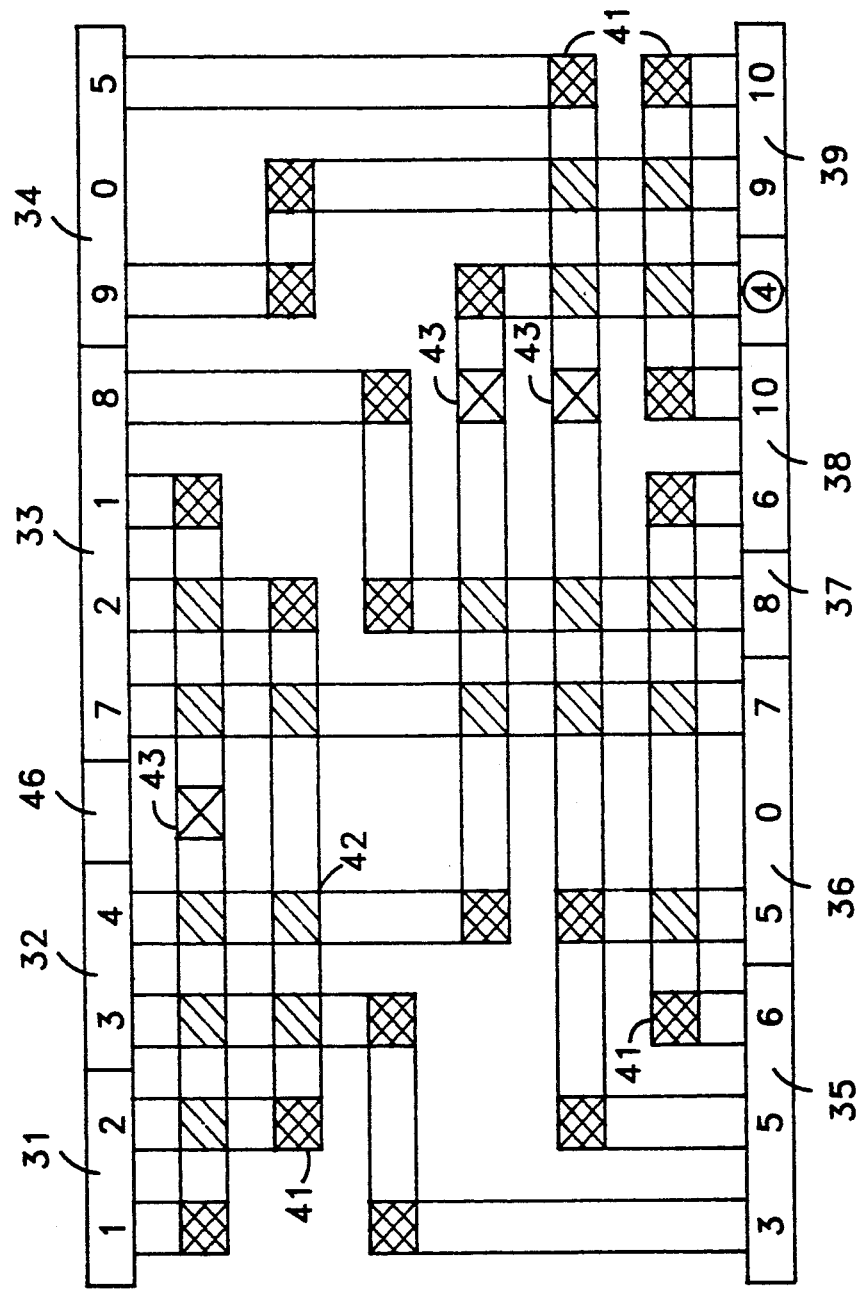
FIG. 8 illustrates the final result after the position with feedthrough between cells is compacted.

Step 19 is then used to compact cell rows and interconnects. The reserved vertical empty positions may not be used and they can be compacted. FIG. 8 shows the final result after the position with feedthrough between cell 33 and cell 34 is compacted. The reserved empty position can be compacted if there are no pins both on the top and bottom cell rows and no post is at that vertical position.

The method then proceeds to block 16 which is the finish.

Thus, it will be apparent, upon reviewing this specification, to one skilled in the art that there has been provided in accordance with the invention, an apparatus and method that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A computer implemented method for determining placement of a plurality of air-bridge posts for a large scale semiconductor device comprising the steps performed by said computer:

locating empty post positions in a plurality of cell rows;

aligning empty post positions on top and bottom cell rows for every maximum distance by inserting and/or removing feedthrough cells and reassigning pin positions for feedthrough lines;

determining connections for a plurality of cells in said cell rows by performing an interconnect routing using a plurality of wires thereby creating a pattern containing a plurality of interconnects;

locating and scanning positions of said wire end positions to detect wire lengths which exceed a predetermined distance for determining the placement positions of said air-bridge posts to provide support for an air-bridge spanning the distance between two wire end positions; and compacting said cell rows and said interconnects.

2. The computer implemented method of claim 1 wherein said step of locating empty post positions comprises the steps of:

locating unused feedthrough positions;

locating pin positions where said pin is accessed through a channel on an opposite side of the cell containing said pin; and locating pin positions which do not contain pins.

3. The computer implemented method of claim 1 wherein said locating and scanning step comprises the steps of:

(a) locating one of said plurality of wires which spans at least a predetermined number of orthogonal tracks;

(b) setting a first memory and a second memory to an end post position of said wire;

(c) scanning said wire to a next position;

(d) setting a second memory to said next position if said next position is one of said empty position;

(e) repeating steps (c) and (d) until a predetermined distance is reached;

(f) designating a position in said second memory as a post position;

(g) updating said first memory with said position in said second memory; and (h) repeating said steps (c)–(g) until a second end of said wire is reached.

4. The computer implemented method of claim 1 wherein said step of compacting said cell rows and said interconnects comprises the step of locating and deleting reserved vertical empty positions if there are no pins on both the top and the bottom cell rows, and no post is added at said vertical position for interconnects.

* * * * *